United States Patent
Maa et al.

(10) Patent No.: US 7,071,042 B1
(45) Date of Patent: Jul. 4, 2006

(54) METHOD OF FABRICATING SILICON INTEGRATED CIRCUIT ON GLASS

(75) Inventors: Jer-Shen Maa, Vancouver, WA (US); Sheng Teng Hsu, Camas, WA (US); Jong-Jan Lee, Camas, WA (US); Douglas J. Tweet, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 11/073,163

(22) Filed: Mar. 3, 2005

(51) Int. Cl.
*H01L 21/84* (2006.01)

(52) U.S. Cl. ............ 438/166; 438/479; 438/496; 438/795; 438/796; 257/E21.333; 257/E21.475; 257/E21.415

(58) Field of Classification Search ............ 438/166, 438/479, 496, 795, 796, FOR. 201; 257/E21.333, 257/E21.475, E21.415
See application file for complete search history.

(56) References Cited

U.S. PATENT DOCUMENTS

| | | | | |
|---|---|---|---|---|
| 5,771,110 A * | 6/1998 | Hirano et al. | ............ | 257/72 |
| 6,140,668 A * | 10/2000 | Mei et al. | ............ | 257/66 |
| 6,204,535 B1 * | 3/2001 | Yamazaki et al. | ............ | 257/353 |
| 6,303,411 B1 * | 10/2001 | Camm et al. | ............ | 438/149 |
| 6,337,109 B1 * | 1/2002 | Yamazaki et al. | ............ | 427/555 |
| 6,620,711 B1 * | 9/2003 | Yamazaki | ............ | 438/486 |
| 2001/0025960 A1 * | 10/2001 | Ohtani et al. | ............ | 257/72 |
| 2001/0034089 A1 * | 10/2001 | Yamazaki et al. | ............ | 438/166 |
| 2001/0049163 A1 * | 12/2001 | Yamazaki et al. | ............ | 438/158 |
| 2002/0127827 A1 * | 9/2002 | Yamazaki et al. | ............ | 438/486 |
| 2002/0146868 A1 * | 10/2002 | Miyasaka | ............ | 438/149 |
| 2004/0132293 A1 * | 7/2004 | Takayama et al. | ............ | 438/689 |
| 2004/0147139 A1 * | 7/2004 | Jiang | ............ | 438/795 |

OTHER PUBLICATIONS

Colace et al., *Efficient high-speed near-infrared Ge photodetectors integrated on Si substrates*, Applied Physics Letters, vol. 76, No. 10, pp. 1231-1233 (2000).

* cited by examiner

*Primary Examiner*—George Fourson
(74) *Attorney, Agent, or Firm*—Robert D. Varitz, PC

(57) ABSTRACT

A method of fabricating a silicon integrated circuit on a glass substrate includes preparing a glass substrate; fabricating a silicon layer on the glass substrate; implanting ions into the active areas of the silicon layer; covering the silicon layer with a heat pad material; activating the ions in the silicon layer by annealing while maintaining the glass substrate at a temperature below that of the thermal stability of the glass substrate; removing the heat pad material; and completing the silicon integrated circuit.

17 Claims, 3 Drawing Sheets

US 7,071,042 B1

METHOD OF FABRICATING SILICON INTEGRATED CIRCUIT ON GLASS

FIELD OF THE INVENTION

This invention relates to silicon on glass fabrication technology, and specifically to a method of annealing a silicon-on-glass wafer without exceeding the thermal stability temperature of the glass.

BACKGROUND OF THE INVENTION

Prior art silicon-on-glass fabrication processes require bonding a silicon thin film to glass, while the device fabrication process is similar to that of SOI process, except the highest temperature is limited by the thermal stability of glass, which is generally 650° C. or less. At temperatures lower than 650° C., the implanted ions cannot thoroughly be activated.

Colace et al., *Efficient high-speed near-infrared Ge photodetectors integrated on Si substrates*, Applied Physics Letters, Vol. 76, No. 10, pp 1231–1233 (2000), describes a process whereby pure germanium may be grown directly on a silicon wafer and used in low-cost monolithic transceivers for optical communications applications.

SUMMARY OF THE INVENTION

A method of fabricating a silicon integrated circuit on a glass substrate includes preparing a glass substrate; fabricating a silicon layer on the glass substrate; implanting ions into the active areas of the silicon layer; covering the silicon layer with a heat pad material; activating the ions in the silicon layer by annealing while maintaining the glass substrate at a temperature below that of the thermal stability of the glass substrate; removing the heat pad material; and completing the silicon integrated circuit.

It is an object of the invention to provide a method that may thoroughly activate implanted ions without over heating a glass substrate.

Another object of the invention is to provide a method of RTA a silicon-on-glass substrate through use of a heat pad deposited on a silicon layer.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENT

The method of the invention provides a method to activate implanted ions, such as channel, source and drain ions, without exceeding a temperature which will render a glass substrate thermally unstable.

Figure 1:
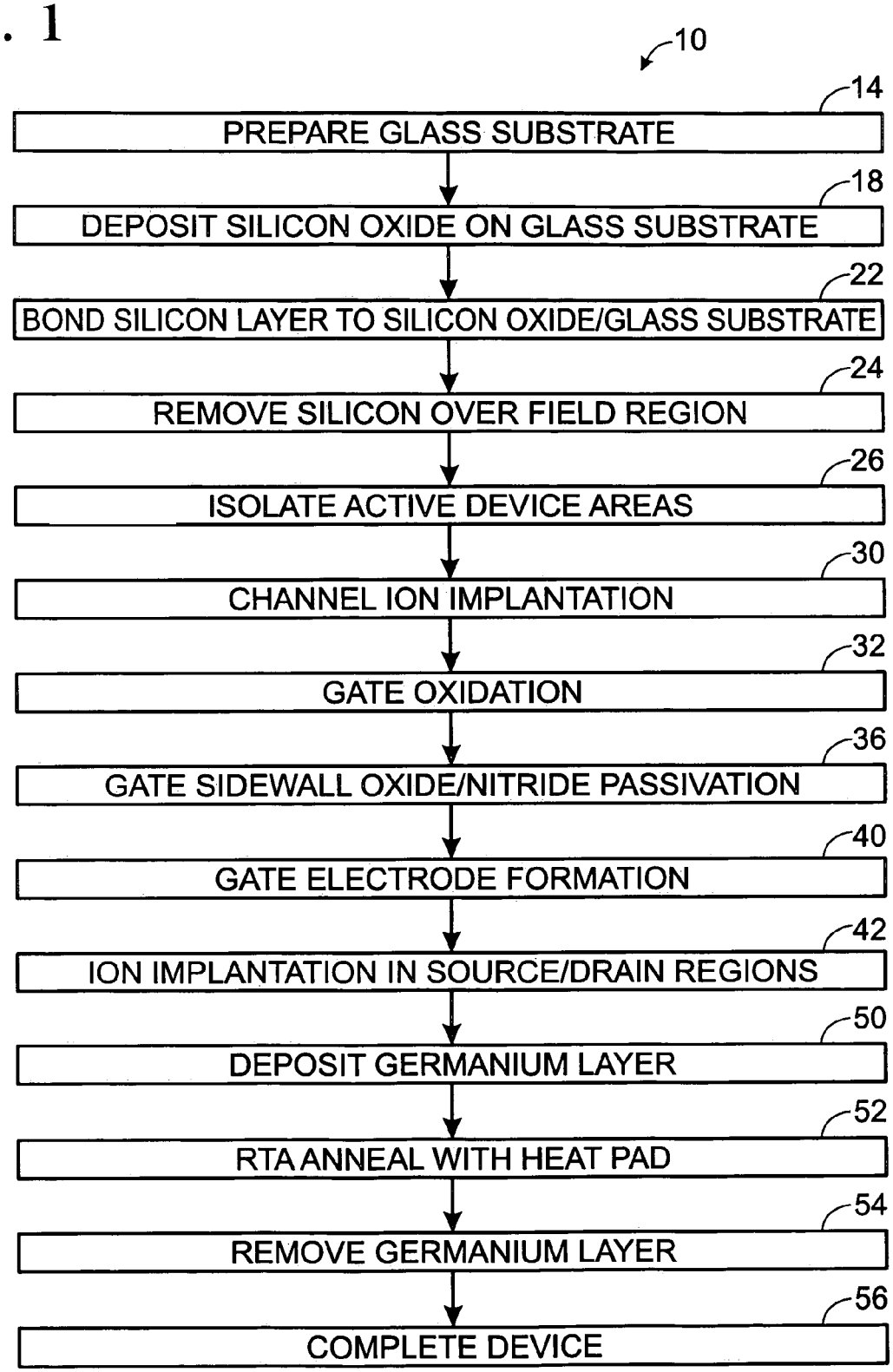
FIG. 1 is a block diagram of the method of the invention.
Figure 2:
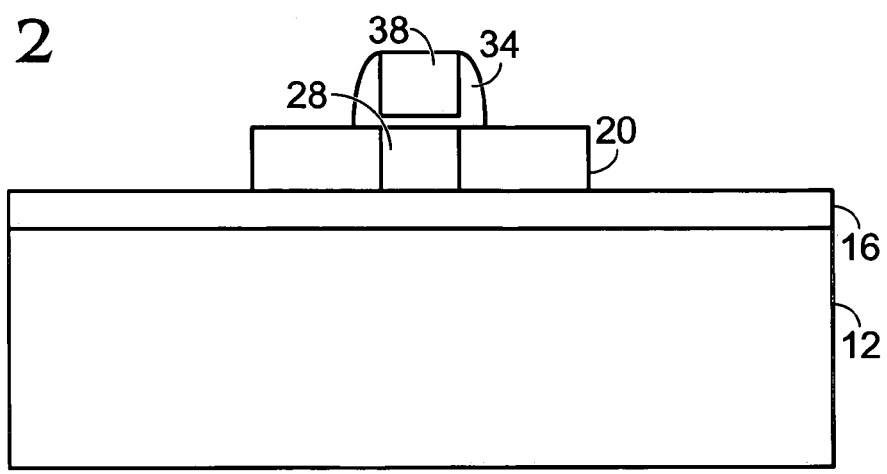
FIG. 2 depicts a complete the front end process up to source/drain ion implantation.

Referring initially to FIGS. 1 and 2, the method of the invention is depicted generally at 10. The method of the invention includes use of a glass substrate 12, which is prepared 14 for a silicon oxide layer 16, which is formed 18 on glass substrate 12 by PECVD, thereby coating glass substrate 12 with a layer of silicon oxide. A silicon thin film 18, either strained, non-strained, amorphous, or polycrystalline, is bonded 22 onto silicon oxide coated glass substrate 16/12. The thickness of silicon oxide layer 16 is between about 10 nm to 1000 nm, depending on the application. Silicon oxide layer 16 is required to enhance the adhesion of a silicon thin film 20 to the glass substrate, which is bonded 22 to silicon oxide layer 16, to prevent out diffusion of glass elements, and to buffer the heat during activation of implanted ions. The thickness of silicon thin film 20 is between about 5 nm to 500 nm, depending on the circuit requirement. The silicon film at the field region is removed 24 and any active device areas isolated 26, followed by channel 28 ion implantation 30, gate oxidation 32, gate sidewall oxide/nitride passivation 36, gate electrode 38 formation 40, ion implantation 42, using any suitable state-of-the-art process, to provide a source 44 and a drain 46.

Figure 3:
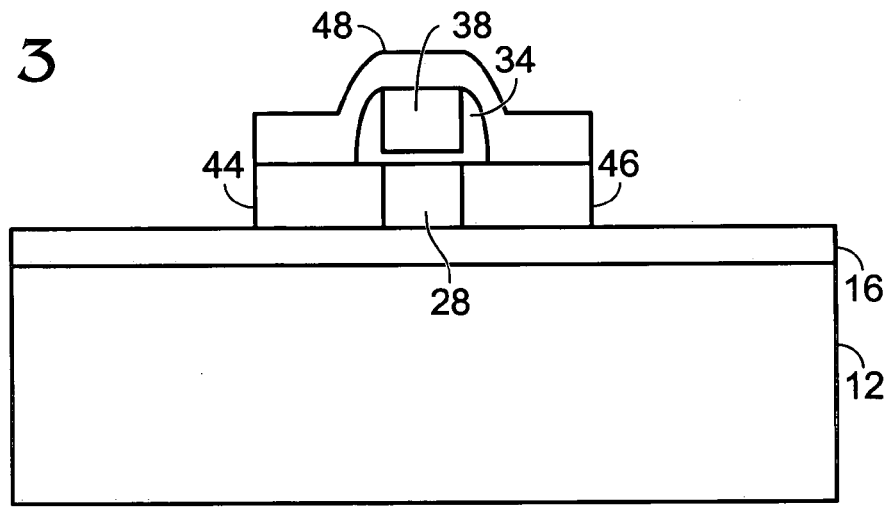
FIG. 3 depicts the structure after deposition and selective etching of a germanium thin film

After the front end IC fabrication and source/drain ion implantation, as shown in FIG. 2, a thin layer, e.g., between about 500 nm to 2000 nm, of germanium 48 is deposited 50 on the glass substrate. The germanium film is patterned and etched, such that only the active area of the device is covered with a germanium layer, as shown in FIG. 3. Optionally, a thin layer, e.g., between about 10 nm to 50 nm, of silicon oxide may be deposited prior to the germanium thin film deposition. The wafer is than annealed 52 in a rapid thermal annealing (RTA) chamber, wherein the wavelength of the heating light includes light in the IR and near IR region, although other wavelengths may be suitable. The germanium layer absorbs light, which increases the temperature of the germanium layer. The heat is then transferred to the silicon beneath the germanium blanket, thereby activating the implanted ions.

After the annealing process is completed, the germanium film is selectively removed, preferably by a wet etch process. Wet etching solutions are available which etch germanium but not silicon or $SiO_x$, and include diluted or undiluted $H_2O_2$, Piranhe ($H_2SO_4$:$H_2O_2$), SC1 ($NH_4OH$:$H_2O_2$:$H_2O$), SC2 ($HCl$:$H_2O_2$:$H_2O$), and other solutions which are well known to those of ordinary skill in the art.

The resulting structure is the same as that of FIG. 2, except the implanted ions in silicon source, drain, and channel regions are activated. The RTA power and length of annealing depends on the thickness of the silicon film as well as the thickness of Ge film. After the germanium thin film is removed, passivation oxide is deposited, followed by photoresist deposition and patterning for contact etch and metallization, and the device is completed by state-of-the-art processes 56.

A thorough annealing and activation of the implanted n+ and p+ ions in the source/drain requires a temperature which is beyond the thermal stability of the glass substrate. As a result, as described in connection with prior art processes, the resulting device is not able to reduce the resistivity of silicon at the source/drain regions to a satisfactorily low level for the performance of the transistor. Salicidation may be used to reduce the source/drain series resistance, however, if the activated doping density is too low, the contact resistance of the silicide will be too high. In addition, the resistance at the gap between silicide and the channel will be too high. Therefore, a high degree of activation of the implanted ions in the device is necessary to bring the performance of the device to an acceptable level.

Low power laser annealing may be used to activate the implanted ions in the source and drain region. However, the laser annealing process is time consuming and may over heat the glass in the field area. Selective laser heating of the active area is too slow to be economically feasible.

The method of the invention uses RTA with a heat pad, e.g., germanium layer 48. The heat pad is heated during RTA process by absorbing light in the near-IR range. Heat from the heat pad passes into the silicon by conduction to activate the implanted ions in the silicon. The lamp power, usually from a tungsten halogen lamp, depends on the arrangement and lamp design of the RTA system, however, the power may be specified by comparison with a silicon wafer under the same power. The temperature of the silicon wafer may be determined as a reference. A typical temperature for an equivalent silicon wafer is in the range of between about 650° C. to 1000° C. The anneal time is between about 5 seconds to 30 minutes.

Figure 4:
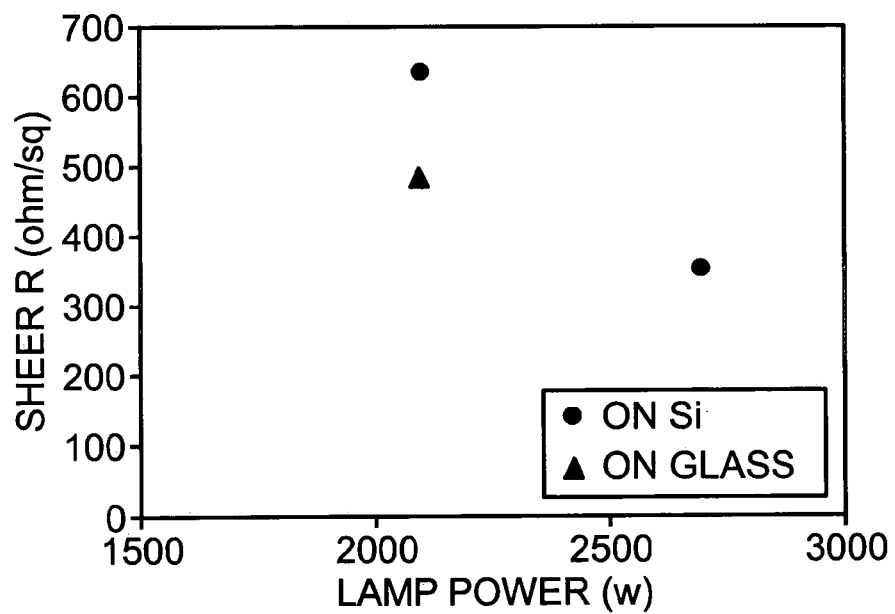
FIGS. 4 and 5 depicts a comparison of the activation of amorphous silicon on glass and silicon wafers.
Figure 5:
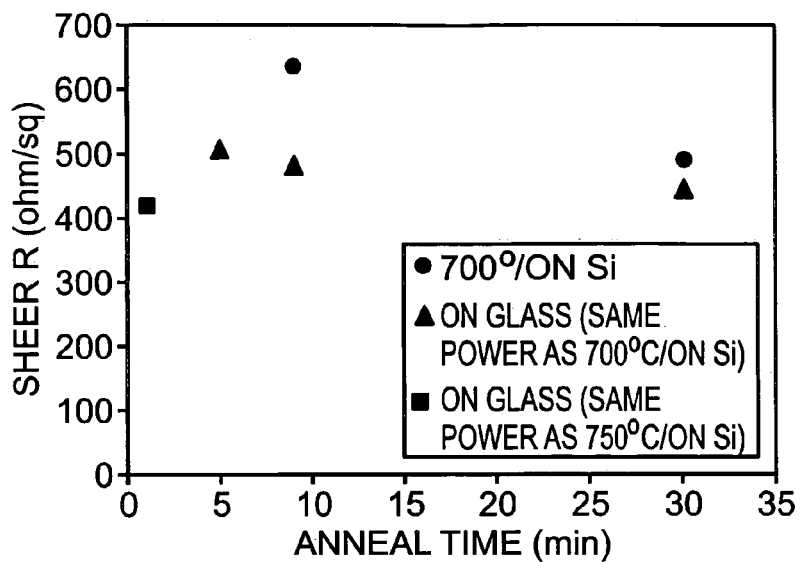

As an example, a 121 nm-thick amorphous silicon (a-Si) film was deposited on a TEOS coated glass wafer, where TEOS is tetraethylorthosilicate oxide, also know as oxane. The a-Si layer was implanted with phosphorus at 20 Kev for a dose of $2 \times 10^{15}$ cm$^{-2}$. This structure was coated with a thin TEOS layer and covered with about 1000 nm of germanium film. RTA annealing experiments demonstrated that the sheet resistance reduction of the a-Si on glass was more pronounce than a similar film deposited on an oxidized silicon wafer. This is shown in FIG. 4 as a function of lamp power, and in FIG. 5 as a function of anneal time.

The data clearly demonstrates the effectiveness of germanium layer 48 as a heat absorbing blanket. Proper RTA procedure are designed to maximize the heat input to the silicon region, while keeping the glass at a relatively lower temperature. An alternate method of the invention is to use a pulse RTA anneal, thereby annealing the sample with a short pulse and at a higher temperature, wherein the desired pulse repetition will supply enough thermal energy for activation, but will keep the glass at a temperature below 650° C.

Figure 6:
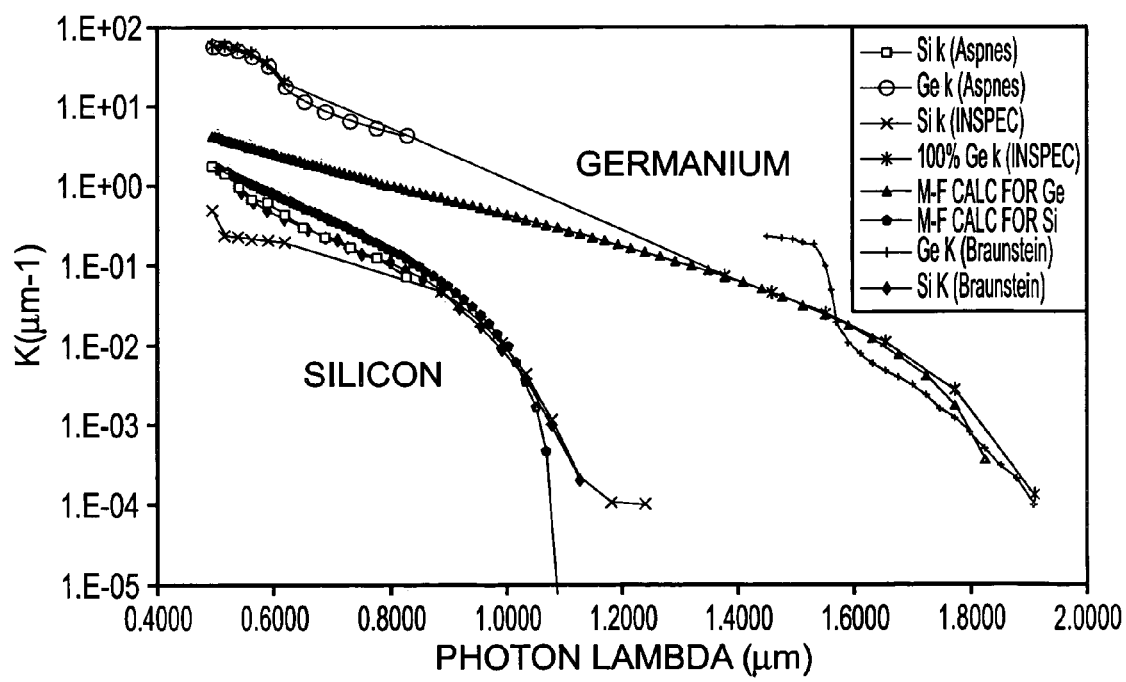
FIG. 6 depicts the extinction coefficient of germanium and silicon, showing high absorption of germanium in the NIR range.

Germanium demonstrates high light absorption in the near-IR region, as shown in FIG. 6. Glass and silicon oxide are very transparent to light having wavelengths in the 1000 nm to 2000 nm spectrum. When a silicon oxide coated glass substrate, having germanium mesa islands, is heated in a RTA furnace, the germanium islands are heated while there is only a minimal increase in the glass temperature. This phenomenon may be used to locally heat the silicon to activate implanted ions without over heating the glass substrate.

Thus, a method of fabricating silicon integrated circuit on glass has been disclosed. It will be appreciated that further variations and modifications thereof may be made within the scope of the invention as defined in the appended claims.

We claim:

1. A method of fabricating a silicon integrated circuit on a glass substrate, comprising:
   preparing a glass substrate;
   fabricating a silicon layer on the glass substrate;
   implanting ions into the active areas of the silicon layer;
   covering the silicon layer with a germanium heat pad material;
   activating the ions in the silicon layer by annealing while maintaining the glass substrate at a temperature below that of the thermal stability of the glass substrate;
   removing the heat pad material; and
   completing the silicon integrated circuit.

2. The method of claim 1 wherein said covering the silicon layer with a germanium heat pad material includes covering with a layer of germanium having a thickness of between about 500 nm to 2000 nm.

3. The method of claim 1 wherein said activating the ions in the silicon layer by annealing while maintaining the glass substrate at a temperature below that of the thermal stability of the glass substrate includes annealing in an RTA chamber and heating the heat pad material by light energy to keep the temperature of the glass substrate below a temperature of about 650° C.

4. The method of claim 1 which further includes, after preparing the glass substrate, depositing a layer of silicon oxide on the glass substrate, and wherein said fabricating a silicon layer on the glass substrate includes bonding a silicon layer to the silicon oxide layer on the glass substrate.

5. The method of claim 1 wherein said removing the heat pad material includes removing the heat pad material by etching in a solution taken from the group of solutions consisting of diluted or undiluted $H_2O_2$, Piranhe ($H_2SO_4$:$H_2O_2$), SC1 ($NH_4OH$:$H_2O_2$:$H_2O$), and SC2 (Hcl:$H_2O_2$:$H_2O$).

6. A method of fabricating a silicon integrated circuit on a glass substrate, comprising:
   preparing a glass substrate;
   fabricating a silicon layer on the glass substrate;
   implanting ions into the active areas of the silicon layer;
   covering the silicon layer with a germanium heat pad material;
   activating the ions in the silicon layer by annealing while maintaining the glass substrate at a temperature below that of the thermal stability of the glass substrate, including annealing in an RTA chamber and heating the heat pad material by light energy to keep the temperature of the glass substrate below a temperature of about 650° C.;
   removing the heat pad material; and
   completing the silicon integrated circuit.

7. The method of claim 6 wherein said covering the silicon layer with a heat pad material includes covering the silicon layer with a layer of germanium having a thickness of between about 500 nm to 2000 nm.

8. The method of claim 6 which further includes, after preparing the glass substrate, depositing a layer of silicon oxide on the glass substrate, and wherein said fabricating a silicon layer on the glass substrate includes bonding a silicon layer to the silicon oxide layer on the glass substrate.

9. The method of claim 6 wherein said removing the heat pad material includes removing the heat pad material by etching in a solution taken from the group of solutions consisting of diluted or undiluted $H_2O_2$, Piranhe ($H_2SO_4$:$H_2O_2$), SC1 ($NH_4OH$:$H_2O_2$:$H_2O$), and SC2 (Hcl:$H_2O_2$:$H_2O$).

10. A method of fabricating a silicon integrated circuit on a glass substrate, comprising:
    preparing a glass substrate;
    depositing a layer of silicon oxide on the glass substrate;
    bonding a silicon thin film layer to the silicon oxide layer on the glass substrate;
    removing a portion of the silicon layer over field regions of the integrated circuit device;
    isolating active device areas;
    implanting ions into a channel region of the integrated circuit device;

oxidizing a gate region of the integrated circuit device;
forming a gate sidewall structure;
forming a gate electrode within the gate sidewall structure;
implanting ions into the active areas of the silicon layer;
covering the silicon layer with a germanium heat pad layer;
activating the ions in the silicon layer by annealing while maintaining the glass substrate at a temperature below that of the thermal stability of the glass substrate by transferring heat from the germanium heat pad layer into the silicon layer;
removing the heat pad material; and
completing the silicon integrated circuit.

11. The method of claim 10 wherein said covering the silicon layer with a germanium heat pad layer includes covering the silicon layer with a layer of germanium having a thickness of between about 500 nm to 2000 nm.

12. The method of claim 10 wherein said activating the ions in the silicon layer by annealing while maintaining the glass substrate at a temperature below that of the thermal stability of the glass substrate includes annealing in an RTA chamber and heating the heat pad material by light energy to keep the temperature of the glass substrate below a temperature of about 650° C.

13. The method of claim 12 wherein said annealing includes providing light energy from a tungsten halogen lamp.

14. The method of claim 13 wherein the light from the lamp has a wavelength of between about 1000 nm to 2000 nm.

15. The method of claim 10 wherein said removing the heat pad material includes removing the heat pad material by etching in a solution taken from the group of solutions consisting of diluted or undiluted $H_2O_2$, Piranhe ($H_2SO_4$:$H_2O_2$), SC1 ($NH_4OH$:$H_2O_2$:$H_2O$), and SC2 ($Hcl$:$H_2O_2$:$H_2O$).

16. The method of claim 10 wherein said depositing a layer of silicon oxide on the glass substrate includes depositing a layer of silicon oxide on the glass substrate having a thickness of between about 10 nm to 1000 nm, to enhance adhesion of the silicon thin film, to prevent out diffusions of glass elements, and to buffer heat during annealing.

17. The method of claim 10 wherein said bonding a silicon thin film layer to the silicon oxide layer on the glass substrate includes bonding a layer of silicon thin film having a thickness of between about 5 nm to 500 nm.

* * * * *